(12) United States Patent
Breinlinger et al.

(10) Patent No.: US 7,977,956 B2
(45) Date of Patent: Jul. 12, 2011

(54) METHOD AND APPARATUS FOR PROBE CARD ALIGNMENT IN A TEST SYSTEM

(75) Inventors: Keith J. Breinlinger, San Ramon, CA (US); Benjamin N. Eldridge, Danville, CA (US); Eric D. Hobbs, Livermore, CA (US); Douglas S. Ondricek, Dallas, TX (US)

(73) Assignee: FormFactor, Inc., Livermore, CA (US)

( * ) Notice: Subject to any disclaimer, the term of this patent is extended or adjusted under 35 U.S.C. 154(b) by 85 days.

(21) Appl. No.: 12/431,271

(22) Filed: Apr. 28, 2009

(65) Prior Publication Data
US 2010/0271062 A1    Oct. 28, 2010

(51) Int. Cl.
*G01R 31/00* (2006.01)
*G01R 31/20* (2006.01)
(52) U.S. Cl. ......... 324/750.16; 324/750.24; 324/756.03; 324/762.01; 324/754.07
(58) Field of Classification Search ........... 324/754–765
See application file for complete search history.

(56) References Cited

U.S. PATENT DOCUMENTS

| | | | | |
|---|---|---|---|---|
| 4,985,676 A | * | 1/1991 | Karasawa | 324/754 |
| 5,621,313 A | * | 4/1997 | Tsuta | 324/158.1 |
| 6,784,678 B2 | * | 8/2004 | Pietzschmann | 324/750.22 |
| 7,342,402 B2 | | 3/2008 | Kim et al. | |
| 7,405,584 B2 | * | 7/2008 | Fujita et al. | 324/758 |
| 7,777,510 B2 | * | 8/2010 | Matsuzawa | 324/758 |
| 2005/0140380 A1 | * | 6/2005 | Fukasawa et al. | 324/754 |
| 2008/0150566 A1 | | 6/2008 | Kim et al. | |

* cited by examiner

*Primary Examiner* — Ha Tran T Nguyen
*Assistant Examiner* — Emily Y Chan
(74) *Attorney, Agent, or Firm* — Kirton & McConkie

(57) ABSTRACT

Embodiments of methods and apparatus for aligning a probe card assembly in a test system are provided herein. In some embodiments, an apparatus for testing devices may include a probe card assembly having a plurality of probes, each probe having a tip for contacting a device to be tested, and having an identified set of one or more features that are preselected in accordance with selected criteria for aligning the probe card assembly within a prober after installation therein. In some embodiments, the identity of the identified set of one or more features may be communicated to the prober to facilitate a global alignment of the probe card assembly that minimizes an aggregate misalignment of all of the tips in the probe card assembly.

17 Claims, 5 Drawing Sheets

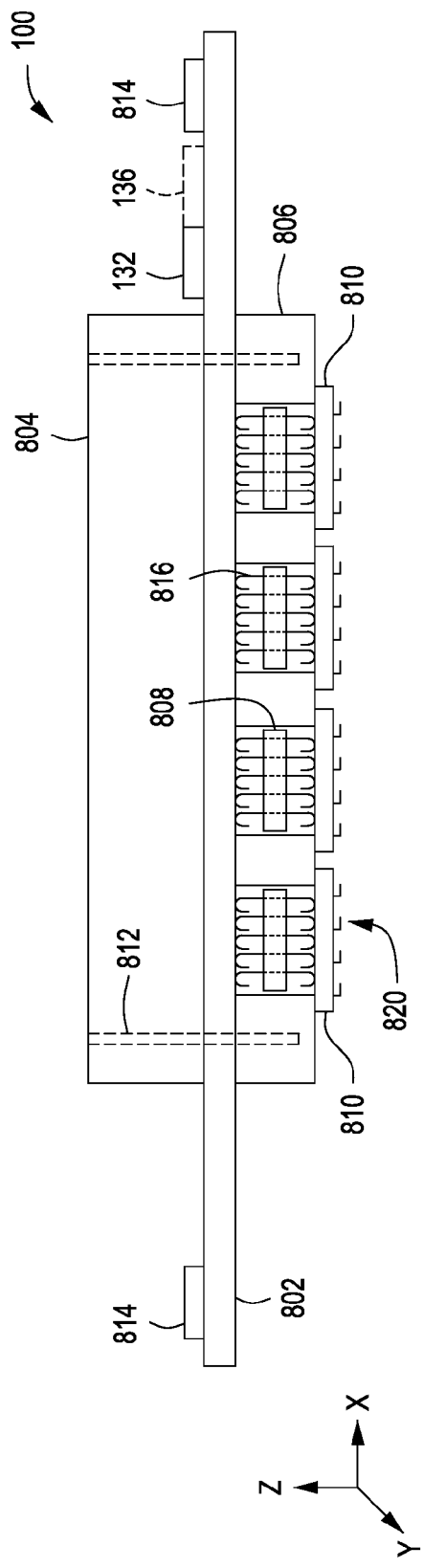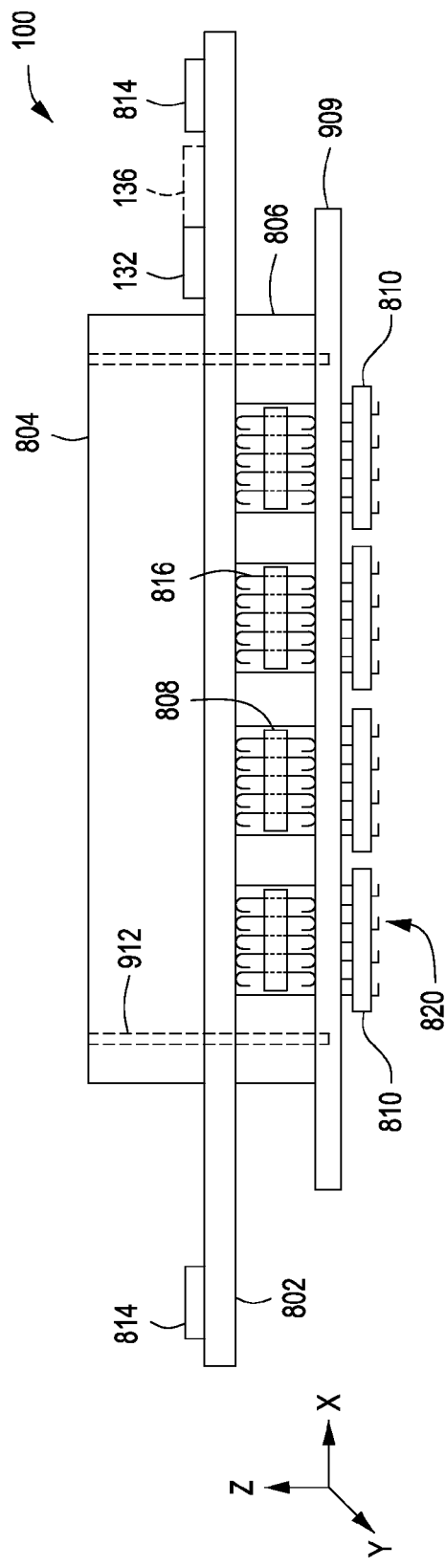

METHOD AND APPARATUS FOR PROBE CARD ALIGNMENT IN A TEST SYSTEM

BACKGROUND

1. Field

Embodiments of the present invention generally relate to semiconductor testing.

2. Description of the Related Art

Testing is an important step in the fabrication of semiconductor devices. Typically, partially or fully completed semiconductor devices are tested by bringing terminals disposed on an upper surface of a device to be tested—also referred to as a device under test (or DUT)—into contact with probes, for example, as contained in a probe card assembly, as part of a test system. An important aspect of such testing is the alignment between the probes of the probe card assembly and the terminals of the DUT.

Typically, this is accomplished within a test system by locating the position of several randomly selected tips of the probes using, for example, a camera and performing a best fit calculation to determine the position of the probe card assembly within the test system. However, such alignment techniques rely on a statistically insignificant sampling of a few probes out of, typically, hundreds, thousands, or tens of thousands. Therefore, local tip position variation may lead to poor global alignment of the probe card assembly. This problem may be amplified in large area array probe card assemblies. Also, in instances where tip positions are selected that are grouped near the center of the probe array, any misalignment due to such local tip position variation may further be undesirably amplified.

Moreover, as the size of features formed on the DUT continue to be reduced, and/or spaced more closely together, greater numbers of probes may be disposed on the probe card and/or may be more closely spaced together, thereby requiring more precise alignment between the probes and the terminals of the DUT.

One solution to the above problem could be to program the test system to look at more tips of the probes to improve the statistical sample size. However, such a solution would undesirably increase the amount of time required to locate and align the probe card assembly within the test system, thereby reducing test system uptime and testing throughput.

Therefore, there is a need for an improved apparatus and methods for aligning a probe card assembly with a device under test in a test system.

SUMMARY

Embodiments of methods and apparatus for aligning a probe card assembly in a test system are provided herein. In some embodiments, an apparatus for testing devices may include a probe card assembly having a plurality of probes, each probe having a tip for contacting a device to be tested, and having an identified set of one or more features that are preselected in accordance with selected criteria for aligning the probe card assembly within a prober after installation therein.

In some embodiments, a method for aligning a probe card assembly in a test system may include providing to a prober information comprising identity information identifying a set of one or more features on a probe card assembly having known offsets corresponding to a desired position of tips of a plurality of probes of the probe card assembly; and aligning the probe card assembly in the prober using the identity information.

In some embodiments, a method of producing a tested die may include providing to a prober information comprising identity information identifying a set of one or more features on a probe card assembly having known offsets corresponding to a desired position of tips of a plurality of probes of the probe card assembly; aligning the probe card assembly in the prober using the identity information; and testing a die disposed in the prober with the aligned probe card assembly.

BRIEF DESCRIPTION OF THE DRAWINGS

So that the manner in which the above recited features of the present invention can be understood in detail, a more particular description of the invention, briefly summarized above and others described below, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 8 depicts a schematic side view of a probe card assembly in accordance with some embodiments of the invention.

FIG. 9 depicts a schematic side view of a probe card assembly in accordance with some embodiments of the invention.

Where possible, identical reference numerals are used herein to designate identical elements that are common to the figures. The images used in the drawings are simplified for illustrative purposes and are not necessarily depicted to scale.

DETAILED DESCRIPTION

This specification describes exemplary embodiments and applications of the invention. The invention, however, is not limited to these exemplary embodiments and applications or to the manner in which the exemplary embodiments and applications operate or are described herein. In addition, as the terms "on" and "attached to" are used herein, one object (e.g., a material, a layer, a substrate, etc.) can be "on" or "attached to" another object regardless of whether the one object is directly on or attached to the other object or there are one or more intervening objects between the one object and the other object. Also, directions (e.g., above, below, top, bottom, side, up, down, "x," "y," "z," etc.), if provided, are relative and provided solely by way of example and for ease of illustration and discussion and not by way of limitation. In addition, where reference is made to a list of elements (e.g., elements a, b, c), such reference is intended to include any one or more of the listed elements by itself or in any combination.

The present invention provides methods and apparatus for providing improved alignment of a probe card assembly in a test system. Specifically, in some embodiments, a probe card assembly is provided having one or more identified features that may be visualized by a prober in the test system in order to determine a desired alignment of the probe card assembly within the test system. The probe card assembly may further include a plurality of sets of identified features corresponding to suggested tips for the prober to visualize depending upon the desired test temperature range. The inventive probe card assembly may thus facilitate improved alignment of the probe card assembly without increasing test time, and potentially decreasing setup time, related to aligning the probe card assembly within the test system.

Figure 1:
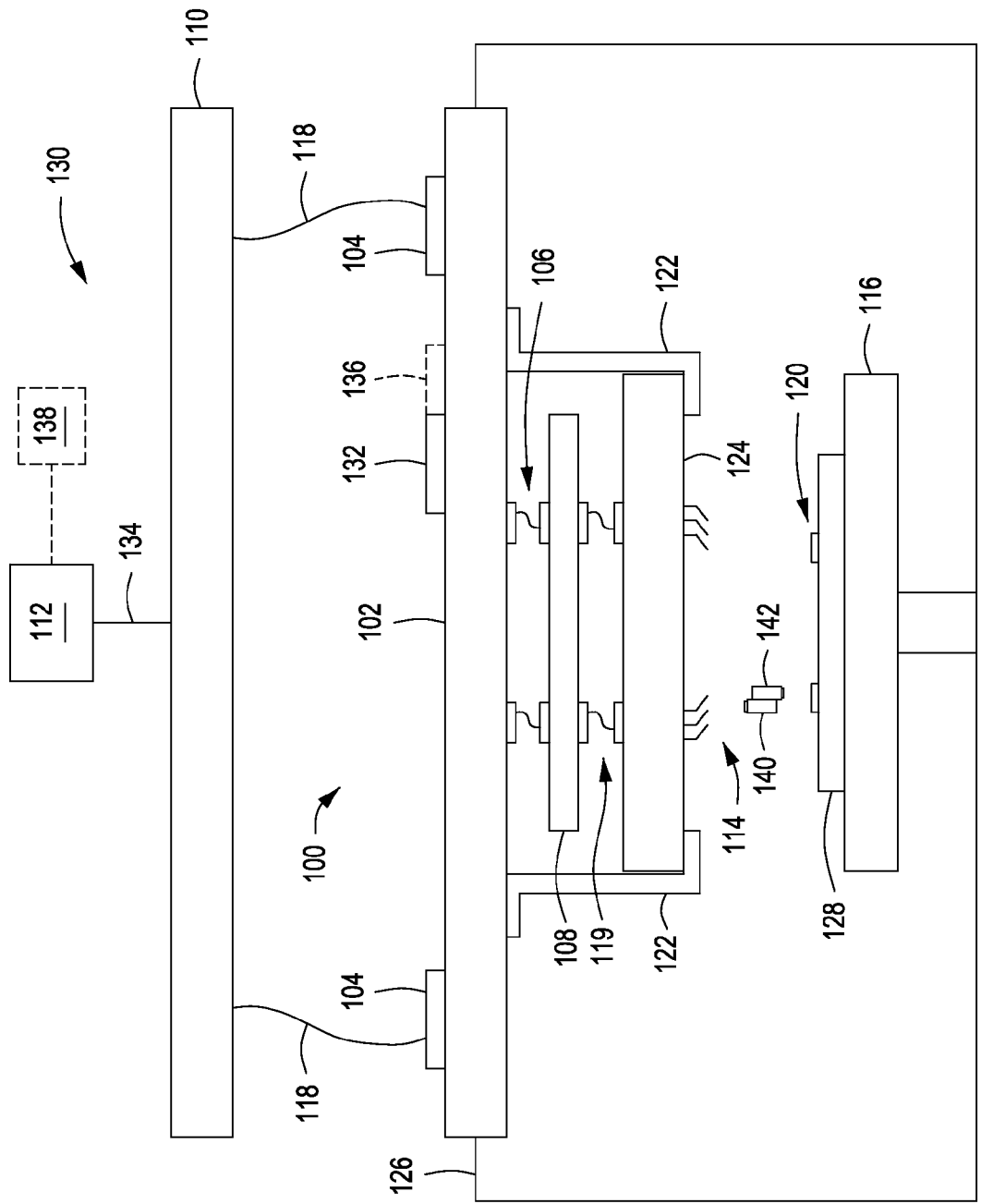
FIG. 1 depicts a schematic side view of test system including a probe card assembly in accordance with some embodiments of the present invention.

FIG. 1 depicts a simplified schematic view of a test system 130 for testing a device under test (DUT) and having a probe card assembly 100 in accordance with some embodiments of the present invention. The test system 130 can generally include a prober 126, the probe card assembly 100, a test system controller 112, and test instruments 110.

The prober 126 can include a stage 116 for mounting a DUT 128 to be tested and may have the probe card assembly 100 mounted thereto or otherwise disposed in an upper portion of the prober 126 above the stage 116. The stage 116 can be movable to contact the DUT 128 with the probe card assembly 100, as discussed in more detail below. The DUT can be any electronic device or devices to be tested. Non-limiting examples of a suitable DUT include one or more dies of an unsingulated semiconductor wafer, one or more semiconductor dies singulated from a wafer (packaged or unpackaged), an array of singulated semiconductor dies disposed in a carrier or other holding device, one or more multi-die electronics modules, one or more printed circuit boards, or any other type of electronic device or devices. The term DUT, as used herein, can refer to one or a plurality of such electronic devices.

Figure 7:
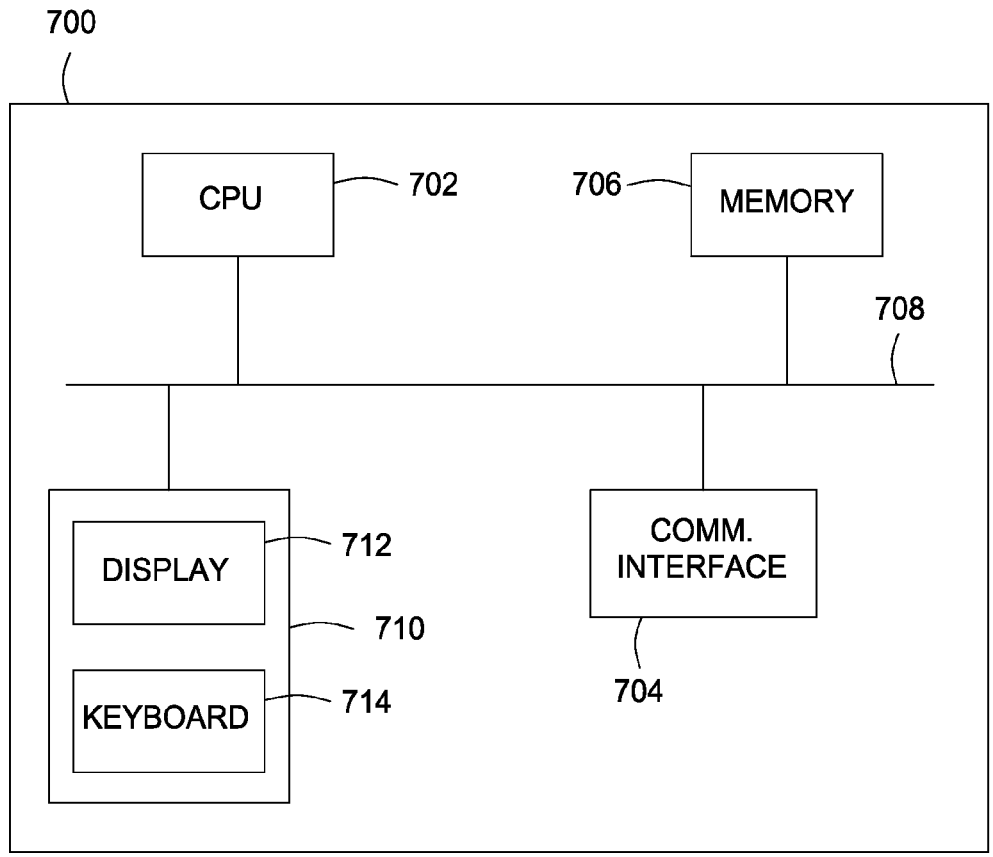
FIG. 7 depicts a schematic diagram of a computer system that may be utilized in a test system in accordance with some embodiments of the invention.

The test system controller 112 may comprise, for example, a host computer (e.g., a general purpose computer) and may be coupled to the test instruments 110 by a communication link 134. For example, FIG. 7 depicts an embodiment of a computer 700 suitable for use as the test system controller 112 (or in conjunction therewith) in accordance with the teachings described herein. The computer 700 may include one or more central processing units (CPU's) 702, one or more communications interfaces 704, a memory 706, and one or more communication buses 708 to interconnect these components. The computer 700 may also include a user interface 710, for example having a display 712 (e.g., to provide a visual display for a user) and/or a keyboard 714 (e.g., to enter commands or other data). The memory 706 may include random access memory (RAM) and may also include non-volatile memory, such as magnetic or optical storage disks. The memory 706 may further include storage that is remotely located from the CPU 702. The memory 706 may store an operating system and other instructions and/or modules adapted to perform the functions discussed herein.

Test data can be generated by the test instruments 110 and transmitted through the probe card assembly 100 to the DUT 128. Test results can then be provided from the DUT 128 back through the probe card assembly 100 to the test instruments 110. The test instruments 110 may transmit the test results to the test system controller 112 for analysis. Overall control of the test instruments 110 during testing may be orchestrated by the test system controller 112.

The probe card assembly 100 depicted in FIG. 1 is for illustration only and other probe card assembly configurations are contemplated (such as the probe card assemblies depicted in FIGS. 8-9, discussed below). The probe card assembly 100 can act as an interface between the test system controller 112 (and/or the test instruments 110) and the DUT 128. For example, test data provided from the test instruments 110 can be divided into individual test channels that can be linked by connectors 118 to the probe card assembly 100. The connectors 118 may be any suitable connectors, such as flexible cable connectors, pogo pins, zero insertion force (ZIF) connectors, or the like. The probe card assembly 100 includes connectors 104 configured to make electrical connections with the test instruments 110 via the connectors 118.

The probe card assembly 100 can fan out one or more of the test channels to a plurality of probes 114 configured to make electrical connections with one or more input and/or output terminals 120 of DUT 128. The probes 114 are typically configured to correspond to the terminals 120 of the DUT 128 and may be arranged in one or more arrays having a desired geometry.

Prior to testing the DUT 128, the prober 126 must align each of the probe card assembly 100 and the DUT 128. For example, the prober 126 may utilize a camera 142 to visualize the DUT 128 and move the DUT 128 into a desired position on the stage 116 (e.g., to look at the DUT 128 and calculate the appropriate alignment based upon a programmed map of the locations of the terminals of the DUT or other locating mechanisms). Similarly, the prober 126 may utilize the camera 142 (or another camera 140) to visualize the probe card assembly 100 to align the probe card assembly 100 within the prober 126. Once both the probe card assembly 100 and the DUT 128 are aligned within the prober 126, the stage 116 may be raised to move the terminals 120 of the DUT 128 into contact with the probes 114 of the probe card assembly 114. In embodiments where the camera (142 and/or 140) is positioned between the probe card assembly 100 and the stage 116, the camera(s) may be moved to a non-interfering position prior to moving the probe card assembly 100 and the stage 116 closer together.

Figure 2:
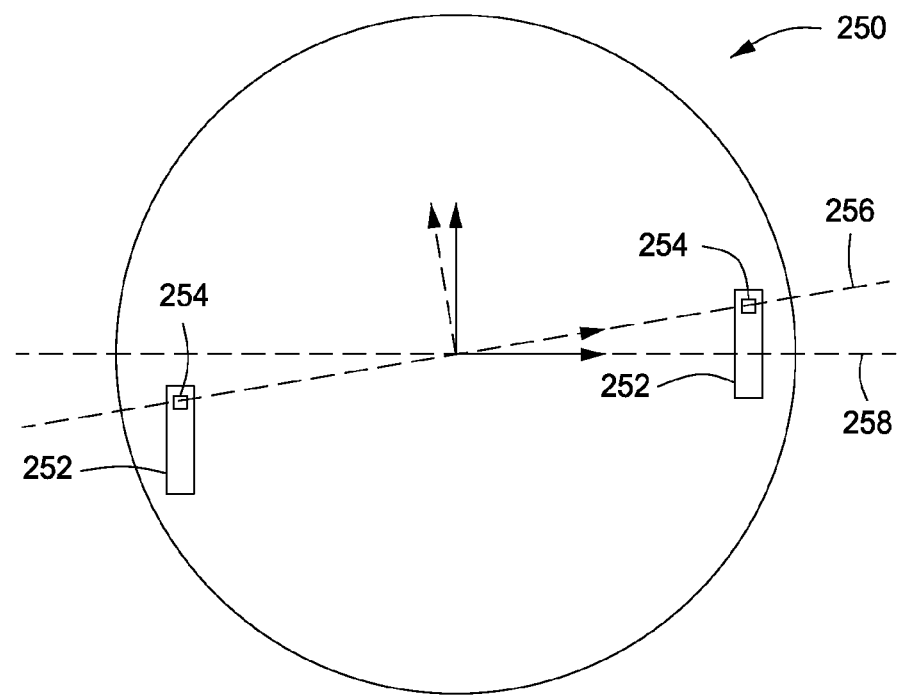
FIG. 2 depicts a bottom view of a conventional probe card illustrating probe card misalignment.

In some conventional test systems, a probe card assembly may be poorly aligned by the prober 126 due to local tip position variation amongst the tips of the probes of the probe card assembly. Poor alignment, as used herein, refers to a global alignment of all the probes of the probe card assembly having a much greater than ideal aggregate alignment of the probes. For example, FIG. 2 depicts an illustrative bottom view of a probe card assembly 250 showing two probes 252 having tips 254 selected by the prober 126 for visualization and alignment. Due to local position variation that may exist amongst the tips 254, the prober 126 may align the probe card assembly along an illustrative axis 256 that is not in alignment with a desired axis 258 representative of acceptable alignment of the probe card assembly 250.

The misalignment of the probe card assembly by the prober 126, leads to a higher risk of misprobing the DUT 128. Such misprobing may include instances where the probes 114 on the probe card assembly 100 fail to contact the one or more terminals 120 of the DUT 128, or where the probes 114 may initially contact the terminals 120 and subsequently slide off of the terminal 120 during testing. The misprobing of the DUT 128 may cause the test to fail and/or may damage either or both of the probes 114 or the DUT 128.

Returning to FIG. 1, to overcome this deficiency, the probe card assembly 100 of the present invention may include at least one identified feature, or at least one set of identified features, (not shown in FIG. 1) that is preselected in accordance with selected criteria for providing alignment of the probe card assembly 100 by the prober 126 after installation in the prober 126 (e.g., the at least one identified feature is used for precision alignment of the probe card assembly 100 within the prober 126 and not for any gross alignment of the probe card assembly 100 that may occur during installation of the probe card assembly 100 in the prober 126.). As used herein, preselected means that the one or more features provided in the one or more sets are identified prior to installation in the prober and that any corresponding offset information associated with each feature is also known prior to installation in the prober such that, once installed, the prober can utilize the preselected features, and any known offset information associated with those features, to align the probe card assembly within the prober so that testing of the DUT may proceed. For example, the prober can receive the identity of the one or more identified features and any corresponding offset information associated with each identified feature in a variety of ways, as described hereinbelow, and may then visualize these identified features (for example, with the camera 140) in order to align the probe card assembly 100 within the prober 126.

The identified features may include tips of the probes 114, or other features provided on the probe card assembly 100, for alignment purposes (as discussed in more detail below). The sets of identified features may be obtained by mapping the actual location of each of the tips of the probes 114 in the probe card assembly 100, and comparing the actual locations of each tip to an ideal, or desired, position (for example, as desired to contact terminals on a particular DUT design or layout). At least one feature can be identified and/or provided which, when visualized by the prober 126 for alignment, can facilitate an overall alignment of the probe card assembly 100 that is within a given tolerance and/or that minimizes an aggregate misalignment of all of the probes 114, or a subset of all the probes 114. In some embodiments, associated information relating to the identified feature or features, such the location or identity of the features, known offset information of the identified features from respective ideal or desired locations, or the like, may be stored for provision to the prober 126. Such associated information may be stored in any suitable location, such as in written form or electronically in a memory device, and may be provided to the prober 126 in any suitable manner, as discussed in more detail below.

Figure 5:
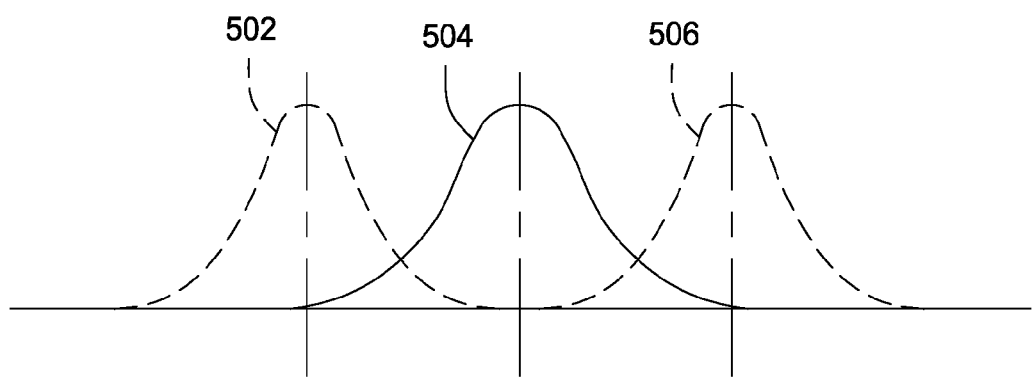
FIG. 5 depicts a graph depicting illustrative tip distributions on a probe card assembly at varying temperatures.

The locations of the tips of the probes 114, relative to each other and relative to the probe card assembly 100, may vary at different temperatures. For example, as shown in FIG. 5, the locations of the tips of the probes 114 (relative to an ideal location) illustratively may have a first distribution 502 at a first temperature, a second distribution 504 at a second temperature, and a third distribution 506 at a third temperature. Additional probe tip location distributions may be present at additional different temperatures. The distributions shown are illustrative only, and any distribution may or may not be normal.

Within each distribution, different features may be identified and/or provided to facilitate aligning the probe card assembly 100 by the prober 126 at the temperatures associated with that distribution. Accordingly, the tips of the probes 114 may be mapped at any one or more temperatures to provide one or more sets of at least one feature corresponding to each temperature at which the tips of the probes 114 are mapped. Each set may contain one or more features best suited, or desired, for visualizing at a particular temperature. The temperature, or temperatures, may correspond to, for example, actual testing temperatures, or other desired temperature (such as an intermediate temperature where testing at multiple temperatures is to occur). For example, a first set of one or more features may be identified for aligning the probe card assembly 100 at a first temperature, a second set of one or more features may be identified for aligning the probe card assembly 100 at a second temperature, and so on for as many desired temperature ranges as needed for a particular application or range of applications.

The identity of the one or more features may be determined to define the set. The identified set of one or more features and associated location information may then be communicated to the prober 126 such that alignment may be calculated directly by the prober 126 upon visualizing the identified one or more features. In addition to the feature identity information, additional information associated with the features in any set may be recorded, stored, and communicated to the prober 126 for use in aligning the probe card assembly 100. Such information may include, for example, the temperature that correlates to the particular set, and location information regarding the features in the set.

Figure 3:
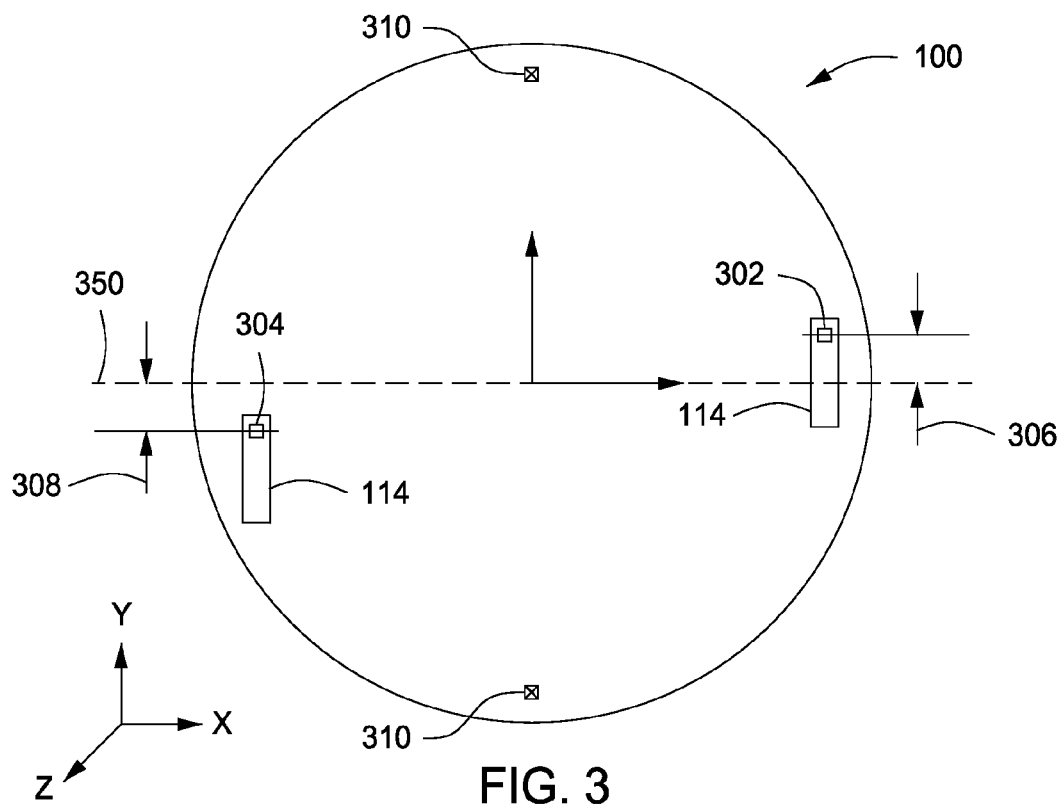
FIGS. 3-4 respectively depict bottom views of probe card assemblies in accordance with some embodiments of the present invention.

The location information may include feature offsets with respect to a known target, ideal, or calculated location of the tip that will provide a global alignment of the probe card assembly 100 that minimizes an aggregate misalignment of all, or a subset of all, of the tips in the probe card assembly 100. For example, FIG. 3 depicts a schematic bottom view of the probe card assembly 100 illustrating exemplary sets of features that may be identified and/or provided for alignment in the prober. In some embodiments, the one or more features may include tips of probes. For example, as illustrated in FIG. 3, the probe card assembly 100 may have a set of probes 114 having respective identified tips 302, 304 that have respective known offsets 306, 308 from a desired position (illustratively shown as a vertical offset from a central axis 350). Although shown as an offset in the "y" direction (relative to the page), the offset information for each probe may include both an x and a y component (e.g., generally in a plane corresponding to the testing position of the DUT) as well as a z component (e.g., generally perpendicular to the x-y plane) to facilitate aligning the probe card assembly 100 in the prober. The offset information for each identified feature is unique to that feature and offset information for other identified features may be similar or different in any or all of the x, y, and/or z dimensions.

Alternatively or in combination, in some embodiments, the features of the probe card assembly 100 may include non-probe structures, for example, a set of features 310 having respective known offsets from a desired position such that visualizing the features 310 may facilitate global alignment of the probe card assembly 100 within the prober in three dimensional space (e.g., in one or more of the x, y, and z directions). For example, each feature 310 may include a pin, a point, a crosshair, a rectangle, a spring or probe tip configured to not contact the DUT, or other locating mechanism for visualizing and obtaining a desired x-y position of the probe card assembly. Each feature 310 may also be configured, such as by a relative height with respect to a reference plane (such as the bottom surface of the probe card assembly or other suitable reference) that may be used to provide alignment information in the z-direction. For example, one or more features 310 may be provided and associated with known offset information such that the prober may visualize the one or more features 310 and position the probe card assembly 100 accordingly based upon position information (such as known offsets from a desired position) in order to provide a desired alignment of the probe card assembly 100.

Any or all of the one or more features 310 may be disposed in any suitable location on the probe card assembly 100 for aligning the tips of the probes 114 within the prober 126. Suitable locations for the features 310 include on a probe substrate (e.g., 124, 810, discussed below) that supports the probes, a support substrate (e.g., 806, 909, discussed below) that supports other components of the probe card assembly (such as probe substrates), a wiring substrate (e.g., 102, 802, discussed below), or any other location on the probe card assembly 100 suitable for prober detection and measurement. The features 310 may be formed on the desired component of the probe card assembly 100 or may be attached thereto.

Figure 4:
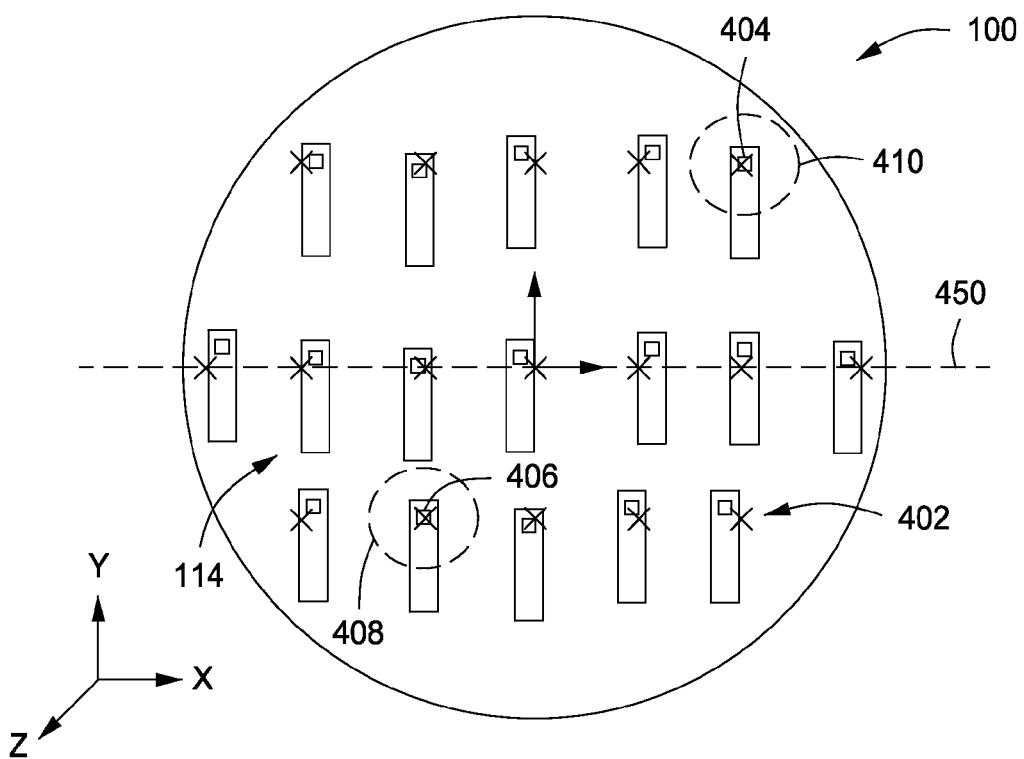

In some embodiments, and as shown in FIG. 4, a map of tip positions may be determined such that one or more tips may be identified to provide tip identity information to the prober 126 sufficient to align the probe card assembly 100 within a desired accuracy. As such, the one or more features of the identified set can include probe tips that are centered within a distribution of all tip positions in the probe card assembly. For example, FIG. 4 depicts a bottom view of a probe card assembly 100 having a plurality of probes 114. The tips (e.g., 404, 406) of the probes may be mapped and compared to desired positions (represented by x's 402) and tips may be selected that fall closest to being in the respective desired positions, or that correspond to providing an alignment having a desired minimized global misalignment for all tips or a subset of all tips. As noted above, the probes 114 may be offset from desired locations in any of an x, y, and/or z direction. As illustratively shown in FIG. 4 at 408 and 410, two tips 404 and 406 are identified as being closest to ideally aligned. Although illustrated using cantilever beam-type probes, the teachings provided herein may be utilized in probe card assemblies having other types of probe configurations as well.

In some embodiments where the features include tips, the tips identified and grouped in a particular set may not necessarily be the most ideally aligned tips with respect to the ideal or target locations, but may be selected such that alignment of the probe card assembly 100 by the prober 126 using those tips provides the desired minimum aggregate misalignment of all tips, or a subset of all tips, in the probe card assembly 100. Moreover, tips (and/or the features 310, discussed above) located closer to the outer perimeter of the probe card assembly 100 may be selected, where feasible, to maximize mechanical advantage in aligning the probe card assembly 100 and minimize amplification of alignment errors as compared to using tips disposed closer to the center of the probe card assembly 100. In addition, although each set in the above examples show and utilize two features, it is explicitly contemplated that greater numbers of features may be included in each set to visualize and align the probe card assembly 100. In some embodiments, there may be a tradeoff of longer processing time associated with greater numbers of features.

The identified set, or sets, of one or more features may be communicated to the prober 126 by various means. For example, in some embodiments, the identities (or location) of the features in the set or sets, may be provided textually in written form to be manually entered into the prober 126. In some embodiments, the identities of the features in the set or sets, may be stored in a memory or other computer readable media and provided to the prober 126 electronically, which may facilitate greater efficiency and reduce the chance of error. The memory or other computer readable media may be coupled to the probe card assembly or may be a separate component (e.g., a disk, a flash drive, or the like). For example, as shown in FIG. 1, the probe card assembly 100 may include a memory 132 disposed thereon for storing the tip identity and location information. The memory 132 may be any suitable memory, such as non-volatile random access memory (NVRAM) or the like.

In some embodiments, the memory 132 may communicate with the prober 126. For example, as illustratively depicted in FIG. 1, the memory 132 may be coupled to the wiring substrate 102. Electrically conductive paths (not shown) may be provided from the memory 132 through the wiring substrate 102 to the connectors 104, through which the memory 132 may communicate with the test system controller 112.

In some embodiments, the memory 132 may be coupled to a wireless transmitter 136 (shown in phantom) or other wireless device that may communicate wirelessly with the prober 126. For example, the transmitter 136 may communicate with a receiver 138 (shown in phantom) coupled to the test system controller 112. The receiver 138 may also be coupled to other components, such as the prober 126, or some other controller (not shown) coupled to the prober 126).

As discussed above, the probe card assembly depicted in FIG. 1 is shown for illustrative purposes only and other configurations of probe card assemblies may also utilize the teachings provided herein. For example, FIG. 8 depicts the probe card assembly 100 according to some other embodiments of the invention. The probe card assembly 100 can include a wiring substrate 802, a stiffener 804, a support substrate 806, interposer substrates 808, and one or more probe substrates 810. The stiffener 804 can be coupled to the support substrate 806 via pins 812 that extend through the wiring substrate 802. The wiring substrate 802 can be configured to float between the stiffener 804 and the support substrate 806. The wiring substrate 802 can support electrical connectors 814 configured to make electrical connections with the test instruments 110.

The support substrate 806 can include openings in which the interposer substrates 808 are respectively disposed. The interposer substrates 808 can electrically couple the wiring substrate 802 to the probe substrates 810. For example, each of the interposer substrates 808 may include electrically conductive spring interconnect structures 816 disposed therethrough that electrically couple the substrate 802 to respective probe substrates 810. Each of the probe substrates 810 can support one or more resilient contact elements 820 as test probes. The probe substrates 810 can be mounted to the support substrate 806. The stiffener 804 and/or the support substrate 806 can provide stiffness in a "z" direction. The pins 812 can provide stiffness in a "z" direction, while being compliant in an "x" and/or "y" direction.

Electrically conductive paths (examples shown below) are typically provided from the connectors 814 through the various substrates to the resilient contact elements 820. For example, in the embodiment depicted in FIG. 8, electrically conductive paths may be provided from the connectors 814 through the wiring substrate 802 to the electrically conductive spring interconnect structures 816. Other electrically conductive paths may be provided from the spring interconnect structures 816 through the probe substrates 810 to the resilient contact elements 820. The electrically conductive paths through the wiring substrate 802, the interposer substrates 808, and the probe substrates 810 can comprise electrically conductive vias, traces, or the like, that may be disposed on, within, and/or through the wiring substrate 802 and the probe substrates 810. The wiring substrate 802, the interposer substrates 808, and the probe substrates 810 can generally be made of any type of suitable material or materials, such as, without limitation, printed circuit boards, ceramics, organic or inorganic materials, and the like, or combinations thereof.

FIG. 9 depicts the probe card assembly 100 according to some other embodiments of the invention, which is similar to FIG. 8, except that the probe substrates 810 can be mounted to a mounting substrate 909. The mounting substrate 909 can be coupled to the stiffener 804 via pins 912. Each of the interposer substrates 808 may include electrically conductive spring interconnect structures 816 coupled to the mounting substrate 909. The probe substrates 810 can be electrically and mechanically coupled to the mounting substrate 909 using, for example, solder or like type connections. The substrate 909 can be configured with a coefficient of thermal expansion (CTE) that matches or nearly matches that of the DUT (e.g., DUT 128 depicted in FIG. 1).

Similar to the embodiment described above with respect to FIG. 8, electrically conductive paths may be provided from the connectors 814 through the wiring substrate 802 to the electrically conductive spring interconnect structures 816. Other electrically conductive paths may be provided from the spring interconnect structures 816 through the mounting substrate 909 to the probe substrates 810. The electrically conductive paths through the mounting substrate 909 can comprise electrically conductive vias, traces, or the like, that may be disposed on, within, and/or through the mounting substrate 909. The mounting substrate 909 can generally be made of any type of suitable material or materials, such as, without limitation, printed circuit boards, ceramics, organic or inorganic materials, and the like, or combinations thereof.

The probe card assemblies depicted above in FIGS. 8 and 9 can include one or more features, or sets of one or more features (such as identified probe tips or features as discussed above with respect to FIGS. 1, 3, and 4) in the manner as discussed above to facilitate alignment of the probe card after installation in the prober.

Figure 6:
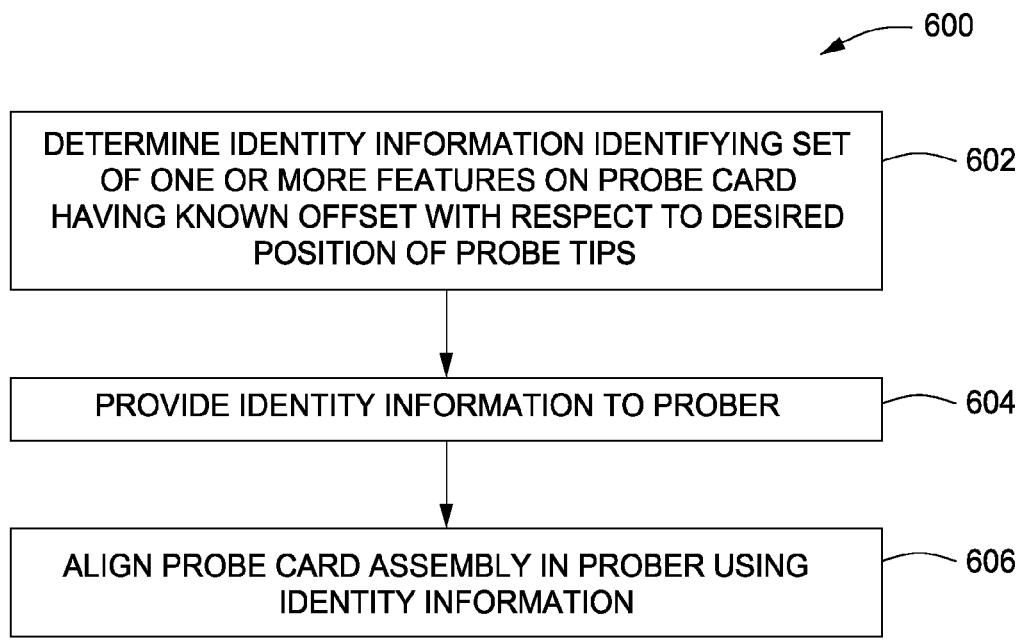
FIG. 6 depicts a flow chart of a process for aligning a probe card assembly in a prober in accordance with some embodiments of the present invention.

By providing a probe card assembly having one or more sets of identified features for alignment, the prober can more efficiently and accurately align the probe card assembly 100 as compared to a conventional alignment based upon random or systematic selection of probe tips to visualize for alignment. Such enhanced accuracy in alignment may reduce the risk of misprobes, faulty testing, or damage to the probe card assembly and/or DUT. For example, FIG. 6 depicts a flow chart of a process 600 for aligning a probe card assembly in accordance with some embodiments of the present invention. The process 600 is described with respect to FIG. 1, but is applicable to other probe card assemblies including, but not limited to, the probe card assemblies 100 described in FIGS. 8 and 9.

The process 600 generally begins at 602, where identity information is determined identifying a set of one or more features on a probe card assembly 100 having a known offset with respect to a desired position of the tips of the probe card assembly. The determination (e.g., preselection) of the set of one or more features, and the known offset with respect to the desired position (if any), may be carried out in any of the ways discussed above. For example, the set of identified feature(s) may be obtained by mapping the actual location of each of the tips of the probes 114 in the probe card assembly 100, and comparing the actual locations of each tip to an ideal, or desired, position. One or more probe tips may be identified, as discussed above with respect to FIGS. 3 and 4, or other features may be provided, such as the features 310 discussed above with respect to FIG. 3.

In some embodiments, one or more features (e.g., 310) may be provided in a desired location on the probe card assembly, such as on a wiring substrate (e.g., 102, 802), a support substrate (e.g., 806), or a mounting substrate (e.g., 909) prior to assembling the probes on the probe card assembly. Subsequently, a plurality of probes may be positioned on the probe card assembly using the features as alignment fiducials. After completion of the assembly of the probe card assembly, the features may then be utilized for alignment of the probe card assembly after installation in the prober. In some embodiments, after assembling and measuring the final position of the probes, the position of the features may be altered (or different features provided) to provide a more accurate alignment feature, if necessary or desired.

The associated information relating to the identified feature(s), such the location or identity of the feature(s), known offset information of the identified features from respective ideal or desired locations, or the like, may be stored for provision to the prober 126. The information relating to the identified feature(s) may be stored in any suitable manner, such as written, stored in an electronic medium (such as a memory device), or the like.

Next, at 604, information comprising feature identity information identifying a set of one or more features on a probe card assembly 100 having a known offset with respect to a desired position of the tips is provided to the prober 126. As used herein, the phrase "provided to the prober" includes, but is not limited to, providing information to a controller that controls the alignment of probe card assembly 100 once installed in the prober 126, such as is performed prior to testing a DUT. As such, the information provided to the prober 126 may be provided directly to the prober 126, to the test system controller 112, or to some other controller (not shown) that may control the alignment of the probe card assembly 100 once installed therein.

As discussed above, the identified set or sets of features may be preselected using any of the techniques discussed above and, where multiple sets are provided, each set may correlate to a different temperature range. For example, each identified set may include at least one feature preselected for visualizing by the prober 126. Associated known offset information for each preselected feature may also be provided, where applicable. As discussed above, the known offset information may include x, y, and/or z coordinate (or other coordinate system) offsets that may be utilized by the prober 126 to align the probe card assembly 100 after installation in the prober 126.

In some embodiments, the information may be provided to the prober 126 manually. For example, the information may be provided in written form or on a disk or other computer readable media. An operator may enter the information, for example via the keyboard 714 of the computer 700 (depicted in FIG. 7 and discussed in more detail above), to provide the information to the prober 126.

Alternatively, the information may be provided to the prober 126 electronically. In some embodiments, the information may be communicated to the prober 126 from the probe card assembly 100. For example, the information may reside in the memory 132 disposed on the probe card assembly 100 and the information may be communicated to the prober 126 from the memory 132 through wired or wireless communications channels (as discussed above). Thus, the information may be communicated to the prober 126 either directly or indirectly, using manual and/or electronic input.

Next, at 606, the probe card assembly 100 may be aligned in the prober 126 using the feature identity information. For example, after being installed in the prober 126, the one or more identified preselected features may be visualized by the prober 126 (e.g., by camera 140) and the prober 126 may adjust the position of the probe card assembly 100 to align the probe card assembly 100 within the prober 126 such that it is in a desired position for testing the DUT 128. As discussed above, the desired position may be a position that minimizes the aggregate misalignment of all tips of probes of the probe card assembly 100 with respect to the corresponding terminals 120 on the DUT 128.

The information provided to the prober 126 may further comprise feature position information relating to a known offset of the one or more features in the set from a desired position of all of the tips, or a subset of all of the tips, of the probes 114. For example, in some embodiments, where the one or more features are ideally positioned, the prober 126 may simply visualize and align to those features. Alternatively, in some embodiments, corresponding known offset information may be provided for the one or more features such that the prober 126 may visualize the one or more features and compensate for their position utilizing the known offset information (e.g., an x, y, and/or z direction compensation) when performing the alignment of the probe card assembly 100. In some embodiments, the one or more features in the set may be probe tips that are centered, or closest to centered, within a distribution of all tip positions on the probe card assembly 100. Upon aligning the probe card assembly 100 in the prober 126, the process 600 ends and (if the DUT 128 has been disposed on the stage 116 and aligned) the testing of the DUT may commence.

Returning to FIG. 1, the probe card assembly 100 may include one or more substrates configured to support the connectors 104 and the probes 114 and to provide electrical connections therebetween. The exemplary probe card assembly 100 shown in FIG. 1 has three such substrates, although in other implementations, the probe card assembly 100 can have more or fewer substrates. In the embodiment depicted in FIG. 1, the probe card assembly 100 includes a wiring substrate 102, an interposer substrate 108, and a probe substrate 124. The wiring substrate 102, the interposer substrate 108, and the probe substrate 124 can generally be made of any type of suitable material or materials, such as, without limitation, printed circuit boards, ceramics, organic or inorganic materials, and the like, or combinations thereof.

Electrically conductive paths (not shown) may be provided from the connectors 104 through the wiring substrate 102 to a plurality of electrically conductive spring interconnect structures 106. Non-limiting examples of suitable electrically conductive paths through the wiring substrate 102 include providing a connection feature (such as a contact pad) on either side of the wiring substrate 102 and electrically coupling the connection features. For example, vias may be provided between the connection features if aligned, and/or trace routing on one or more intermediate layers of the wiring substrate 102 may be provided where the connection features are not aligned. Other electrically conductive paths (similar to the conductive paths above) may be provided from the spring interconnect structures 106 through the interposer substrate 108 to a plurality of electrically conductive spring interconnect structures 119. Still other electrically conductive paths (similar to the conductive paths above) may further be provided from the spring interconnect structures 119 through the probe substrate 124 to the probes 114. The electrically conductive paths through the wiring substrate 102, the interposer substrate 108, and the probe substrate 124 can comprise electrically conductive vias, traces, or the like, that may be disposed on, within, and/or through the wiring substrate 102, the interposer substrate 108, and the probe substrate 124.

The wiring substrate 102, the interposer substrate 108, and the probe substrate 124 may be held together by one or more brackets 122 and/or other suitable means (such as by bolts, screws, or other suitable fasteners). The configuration of the probe card assembly 100 shown in FIG. 1 is exemplary only and is simplified for ease of illustration and discussion and many variations, modifications, and additions are contemplated. For example, a probe card assembly may have fewer or more substrates (e.g., 102, 108, 124) than the probe card assembly 100 shown in FIG. 1. As another example, a probe card assembly may have more than one probe substrate (e.g., 124), and each such probe substrate may be independently adjustable. Non-limiting examples of probe card assemblies with multiple probe substrates are disclosed in U.S. patent application Ser. No. 11/165,833, filed Jun. 24, 2005. Additional non-limiting examples of probe card assemblies are illustrated in U.S. Pat. No. 5,974,662, issued Nov. 2, 1999 and U.S. Pat. No. 6,509,751, issued Jan. 21, 2003, as well as in the aforementioned U.S. patent application Ser. No. 11/165,833. It is contemplated that various features of the probe card assemblies described in those patents and application may be implemented in the probe card assembly 100 shown in FIG. 1 and that the probe card assemblies described in the aforementioned patents and application may be modified in accordance with the teachings disclosed herein. Moreover, FIG. 1 depicts just one illustrative example of the types of probe card assemblies that may incorporate probes as described herein and many other probe card assemblies having various configurations are within the scope of this invention.

Thus, methods and apparatus suitable for aligning probe card assemblies in probers of test systems have been provided herein. The inventive apparatus and methods can provide improved alignment of the probe card assemblies in the probers and may reduce the time required to align with high accuracy. Embodiments of the present invention may further advantageously facilitate direct communication of probe card alignment information with the prober for increased efficiency and reduced likelihood of error.

While the foregoing is directed to embodiments of the present invention, other and further embodiments of the invention may be devised without departing from the basic scope thereof, and the scope thereof is determined by the claims that follow.

The invention claimed is:

1. An apparatus for testing devices, comprising:
a probe card assembly having a plurality of probes, each probe having a tip for contacting a device to be tested, the probe card assembly further having an identified set of one or more features that are preselected in accordance with selected criteria for aligning the probe card assembly within a prober after installation therein of the probe card assembly, the probe card assembly further comprising a digital memory for storing a mapping of the set of one or more features to respective desired positions of the one or more of the tips, wherein the mapping comprises known offsets of the one or more features in the identified set to the respective desired positions.

2. The apparatus of claim 1, wherein the one or more features of the identified set are preselected to provide a global alignment of the probe card assembly that minimizes an aggregate misalignment of all of the tips in the probe card assembly when installed and aligned in a prober.

3. The apparatus of claim 1, wherein the one or more features of the identified set include one or more of the tips of the probes that are centered within a distribution of positions of all of the tips of the probes in the probe card assembly.

4. The apparatus of claim 1, wherein the memory is further for storing the identity of the identified set and location information of the one or more features in the identified set.

5. The apparatus of claim 4, further comprising:
a transmitter coupled to the memory and adapted to wirelessly transmit data stored in the memory to a receiver.

6. The apparatus of claim 1, wherein the identified set corresponds to a testing temperature.

7. The apparatus of claim 1, further comprising:
a plurality of identified sets each having one or more features, each identified set corresponding to a different desired temperature range of testing.

8. The apparatus of claim 1, wherein the one or more features include one or more of the tips of the probes.

9. The apparatus of claim 1, wherein the one or more features include non-probe structures having known offsets corresponding to a desired testing position of the probe card assembly.

10. The apparatus of claim 1, further comprising:
a prober having the probe card assembly coupled thereto.

11. A method for aligning a probe card assembly in a test system, comprising:
installing a probe card assembly in a prober, the probe card assembly comprising tips for contacting an electronic device to be tested;
providing from a memory on the probe card assembly to the prober information comprising a mapping of a set of one or more features on the probe card assembly to respective desired positions of one or more of the tips, the mapping comprising, known offsets corresponding to a desired position of the tips of the plurality of probes of the probe card assembly with respect to the one or more features; and
aligning the probe card assembly in the prober using the mapping information.

12. The method of claim 11, further comprising:
providing to the prober identity information corresponding to a plurality of sets of one or more features, each set corresponding to a different temperature range.

13. The method of claim 11, wherein the information further comprises position information relating to known offsets of the one or more features in the set from a desired position.

14. The method of claim 11, wherein the one or more features in the set include one or more of the tips of the probes that are centered within a distribution of all tip positions on the probe card assembly.

15. The method of claim 11, further comprising:
determining the identity information identifying the set of one or more features.

16. The method of claim 15, wherein determining identity information further comprises:
mapping the actual location of the tips of the plurality of probes in the probe card assembly;
comparing the actual locations of each tip to respective desired positions of the tips; and
preselecting the set of one or more features based upon the comparison.

17. The method of claim 11 further comprising preselecting the one or more features in accordance with selected criteria for aligning the probe card assembly within the prober after installation of the probe card assembly in the prober.

* * * * *